(12) United States Patent
Hirayama et al.

(10) Patent No.: US 6,325,901 B1
(45) Date of Patent: *Dec. 4, 2001

(54) METHOD OF PRODUCING A CATHODE-RAY TUBE AND APPARATUS THEREFOR

(75) Inventors: Kazumasa Hirayama, Yokohama; Hitoshi Takeda, Kounosu; Hisashi Iijima, Omiya; Takeo Ito, Kumagaya; Sakae Kimura, Tokyo; Hisashi Chigusa, Urawa; Yoshimitsu Aramaki, Tokyo, all of (JP)

(73) Assignee: Kabushiki Kaisha Toshiba, Kanagawa-ken (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/171,369
(22) PCT Filed: Apr. 11, 1997
(86) PCT No.: PCT/JP97/01264
§ 371 Date: Oct. 19, 1998
§ 102(e) Date: Oct. 19, 1998
(87) PCT Pub. No.: WO97/39160
PCT Pub. Date: Oct. 23, 1997

(30) Foreign Application Priority Data

Apr. 18, 1996 (JP) .................................................. 8-097180

(51) Int. Cl.[7] .................................................. C23C 14/00
(52) U.S. Cl. .................. 204/192.22; 204/192.23; 204/192.26; 204/192.28; 204/298.11; 204/298.23; 204/298.25

(58) Field of Search .......................... 204/298.25, 192.14, 204/192.26, 192.22, 192.23, 298.2, 298.26, 298.28, 298.15, 298.11, 298.01, 298.02

(56) References Cited

U.S. PATENT DOCUMENTS

| | | | |
|---|---|---|---|
| 3,206,322 | * 9/1965 | Morgan | 204/298 |
| 3,849,283 | * 11/1974 | Jackson et al. | 204/298.26 |
| 4,274,936 | * 6/1981 | Love | 204/192 |
| 4,732,454 | * 3/1988 | Saito et al. | 350/164 |
| 4,804,883 | 2/1989 | Muller et al. . | |
| 4,944,860 | * 7/1990 | Bramhall, Jr. et al. | 204/298.23 |
| 5,372,693 | * 12/1994 | Brauer et al. | 204/298.11 |
| 5,489,369 | * 2/1996 | Bjornard et al. | 204/298.25 |
| 5,538,560 | * 7/1996 | Zejda et al. | 118/730 |
| 5,688,389 | * 11/1997 | Bjornard et al. | 204/298.25 |
| 5,709,785 | * 1/1998 | LeBlanc, III et al. | 204/298.25 |
| 5,772,861 | * 6/1998 | Meredith, Jr. et al. | 204/298.03 |
| 5,783,049 | * 7/1998 | Bright et al. | 204/192.14 |

FOREIGN PATENT DOCUMENTS

| | | |
|---|---|---|
| 2-10459 | 1/1990 | (JP) . |
| 9-137270 | 5/1997 | (JP) . |

* cited by examiner

*Primary Examiner*—Stephen Kalafut
*Assistant Examiner*—Julian A. Mercado
(74) *Attorney, Agent, or Firm*—Pillsbury Winthrop LLP

(57) ABSTRACT

At least an effective region of the face of a panel of a cathode ray tube is held within a vacuum chamber. After the vacuum chamber is hermetically sealed from the outside of the vacuum chamber, a thin film is formed on the face of the panel by using a film-forming means.

14 Claims, 5 Drawing Sheets

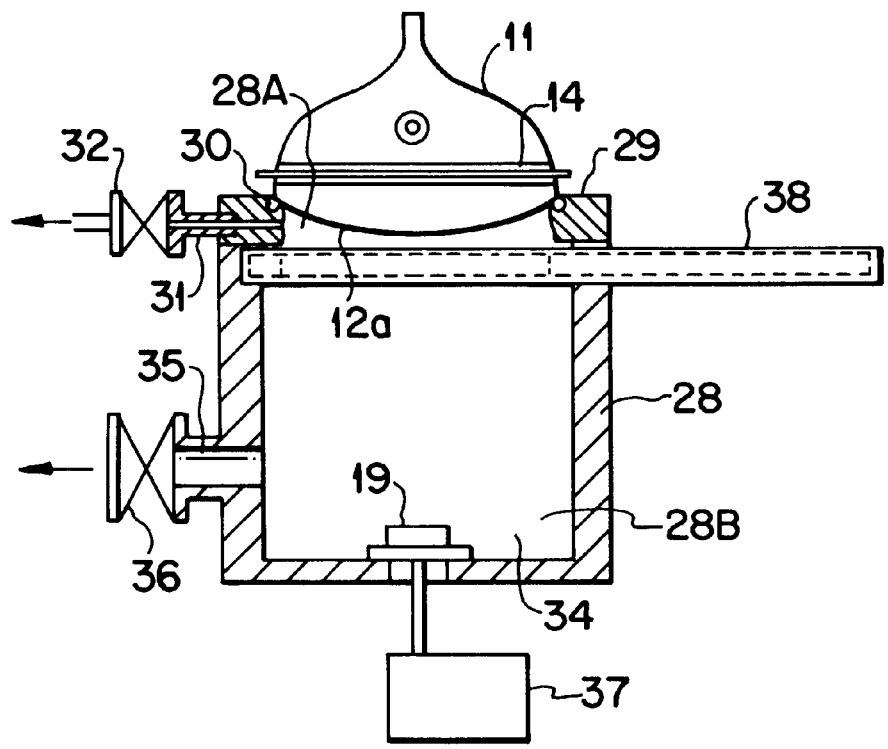
*FIG. 3*
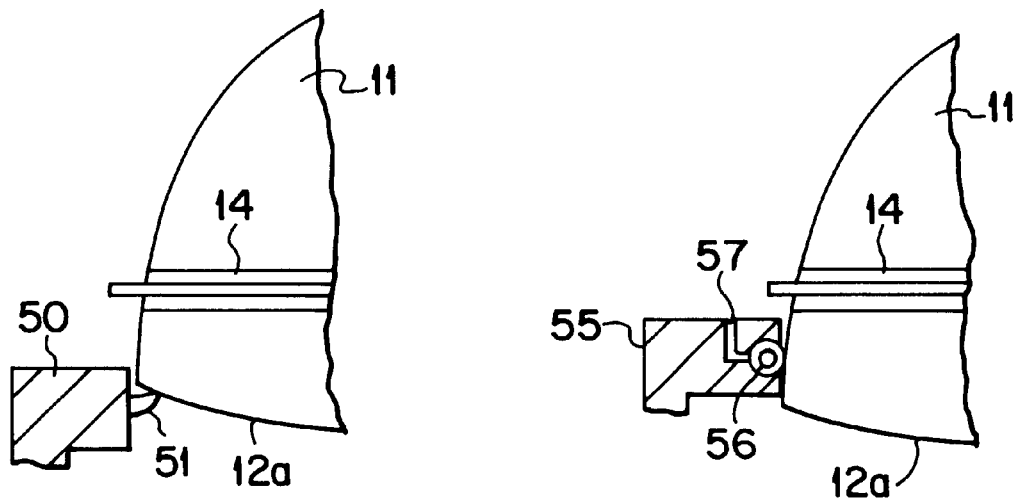
*FIG. 4*        *FIG. 5*

METHOD OF PRODUCING A CATHODE-RAY TUBE AND APPARATUS THEREFOR

FIELD OF THE INVENTION

The present invention relates to a method and apparatus for manufacturing a cathode ray tube, in which a predetermined film is formed on a face of a panel.

BACKGROUND OF THE INVENTION

FIG. 1 schematically shows the construction of a general cathode ray tube. As shown in the drawing, a panel 12 and a funnel 13 are formed integral to constitute a cathode ray tube 11. The inner space of these panel 12 and funnel 13 is held at a high vacuum. In order to allow the cathode ray tube to maintain a high resistance to implosion, a reinforcing metal band 14, which is called an explosion-proof band, is wound about the outer circumferential surface of the panel 12, with a Braun tube-holding metal tool 14a interposed therebetween, such that the panel 12 is fastened by the band 14. Also, the outer wall of the funnel 13 is coated with dag 15 consisting of an organic conductive material layer in order to obtain an electrical conductivity on the surface.

Further, an anti-reflection film of a multi-layer structure (not shown) is formed on the face 12a of the panel 12. A Braun tube equipped with an anti-reflection film, which serves to suppress reflection of the outer light, is used in recent years in mainly color TV receivers, terminal apparatuses of an electronic computer, etc.

Various methods such as a spinning method, a spraying method, a sputtering method and a vapor deposition method have been tried to date in an attempt to form a multi-layered anti-reflection film 16 on the face 12a of the panel 12. However, these methods have been found advantageous in some aspects and defective in other aspects. For example, the wet spinning method and spraying method permit forming the anti-reflection film at a relatively low cost and are suitable for mass production. However, the film is rendered thick, resulting in failure to obtain a desired reflectance.

On the other hand, a dry sputtering method or vapor deposition method permits forming a thin film, however, a large vacuum apparatus and, in some cases, a heating device are required, leading to a marked increase in the facility cost. Also, since a thin film is formed under vacuum in these methods, the atmosphere around a thin film-forming region must be discharged to establish a desired vacuum state, in this case, it takes a long time to establish the desired vacuum state, resulting in failure to improve the productivity.

FIG. 2 schematically shows a thin film-forming apparatus using a conventional sputtering method. As shown in the drawing, the apparatus comprises a vacuum chamber 18. The cathode ray tube 11 on which a thin film is to be formed is arranged within the vacuum chamber 18. A target 19 made of a desired material of the thin film is also arranged within the vacuum chamber 18 to face the cathode ray tube 11. The target 19 is disposed on a support member 20 which also acts as a cooling water pipe.

Each of the support member 20 and an annular body 21 arranged to surround the panel 12 of the cathode ray tube 11 is connected to a high frequency power source device or a DC power source device 22. Also, a magnet 23 is mounted to the support member 20 positioned behind the target 19. In this apparatus, a free space in which a magnetic field and an electric field intersect each other at right angles is formed by the magnet 23 and the DC power source device 22 in front of the surface of the target 19. An inert gas is introduced into the particular free space and a voltage is applied to the inert gas so as to bring about discharge.

A plasma 24 of a high density is generated by the discharge. It should be noted that a large amount of ions within the plasma 24 are accelerated by a bias voltage generated in the vicinity of the target 19 so as to bombard the target 19. As a result, atoms forming the target material are ejected from the target 19. In other words, a sputtering phenomenon takes place. The ejected atoms are deposited on the face 12a of the panel 12 of the cathode ray tube 11 positioned apart from the target 19 so as to form a thin film on the face 12a acting as a workpiece of the panel 12.

Where, for example, the target 19 is formed of zirconium oxide ($ZrO_2$) and sputtering is performed under an argon gas (Ar) atmosphere, a thin film of zirconium oxide is formed on the face 12a of the cathode ray tube 11. Then, the material of the target 19 is changed into silicon, and sputtering is carried out under a mixed gas atmosphere consisting of an argon gas and an oxygen gas ($O_2$) so as to form a thin film of silicon dioxide ($SiO_2$) on the zirconium oxide thin film. In this fashion, different layers collectively forming the anti-reflection film 16 are successively formed on the face 12a of the panel 12, with the result that the face 12a is enabled to exhibit a desired reflectance.

In the conventional method of forming a thin film, however, the entire cathode ray tube 11 is disposed within the vacuum chamber 18 for forming the thin film. Naturally, the vacuum chamber 18 is required to have a large inner volume. Also, it takes much time to establish a vacuum state within the vacuum chamber 18, leading to a low efficiency. It should be noted that the high vacuum within the vacuum chamber 18 is broken every time the cathode ray tube 11 is put into and taken out of the vacuum chamber 18. In other words, the vacuum chamber 18 must be evacuated frequently. It follows that the evacuation to produce a vacuum condition within the vacuum chamber 18 takes much time, leading to a low productivity.

The outer surface of the funnel 13 except the face 12a of the panel 12 of the cathode ray tube 11 is coated with the organic conductive material layer 15. Where the cathode ray tube 11 is used as an electron tube under an ordinary condition, the organic conductive material layer 15 functions for ensuring an electrical conductivity on the surface and, thus, is useful. However, several problems are generated by the organic conductive material layer 15 where the cathode ray tube 11 is disposed under a vacuum environment. First of all, since a gas is contained in the organic conductive material layer 15, it takes a longer time for evacuating the vacuum chamber 18.

For shortening the evacuating time, it is conceivable to heat, for example, the cathode ray tube 11. If the cathode ray tube 11 is heated, however, a new problem is brought about that the organic conductive material layer 15 tends to peel off. The organic conductive material layer 15 peeling off the outer surface of the funnel 13 is accumulated within the vacuum chamber 18 and scattered in the evacuating step so as to be attached to the face 12a of the panel 12 of the cathode ray tube 11. It follows that the product cathode ray tube 11 is rendered defective.

Further, as described previously, the band 14 is wound about the panel 12 for fastening the panel 12 in order to allow the cathode ray tube 11 to maintain a high resistance to implosion. It should be noted in this connection that, if the cathode ray tube 11 is put in the vacuum chamber 18 held at a high vacuum, the pressure difference between the outer space and the inner space of the cathode ray tube 11 is diminished, with the result that the cathode ray tube 11 tends to be swollen and the band 14 is pushed radially outward. Then, if the cathode ray tube 11 is taken out of the vacuum chamber 18, the cathode ray tube 11 is caused to shrink by the atmospheric pressure, leading to a weakened fastening force of the band 14. It follows that the cathode ray tube 11 tends to fail to exhibit a sufficient resistance to implosion.

SUMMARY OF THE INVENTION

As described above, various problems remain unsolved in the conventional method of manufacturing a cathode ray tube. First of all, since the entire cathode ray tube is put in a vacuum chamber held at a high vacuum for forming a thin film, it took much time to produce a vacuum condition within the vacuum chamber. In addition, it is also necessary to discharge to the outside the gas contained in the organic conductive material film included in the cathode ray tube, leading to requirement of a longer evacuating time and, thus, to failure to improve the productivity.

Further, since the cathode ray tube is expanded in some time and shrunk in other time, the fastening force of the reinforcing band is weakened, resulting in failure for the cathode ray tube to ensure a sufficient resistance to implosion.

The present invention, which has been achieved in view the above-noted problems inherent in the prior art, is intended to provide a method and apparatus for manufacturing a cathode ray tube, which permits diminishing the volume of the vacuum space, improving the productivity, and enhancing the safety.

According to a first aspect of the present invention, there is provided a method of manufacturing a cathode ray tube, comprising the steps of:

hermetically sealing a vacuum chamber from the outside of the vacuum chamber and holding at least an effective region of the face of a panel of a cathode ray tube within the vacuum chamber; and forming a thin film on the face of the panel by using film-forming means.

According to a second aspect of the present invention, there is provided an apparatus for manufacturing a cathode ray tube, comprising;

a vacuum chamber;

hermetic sealing means mounted in a part of the vacuum chamber so as to hold at least an effective region of a face of the panel of a cathode ray tube within the vacuum chamber; and a vacuum film-forming device equipped with a film-forming means positioned within the vacuum chamber.

In the present invention, at least an effective region of a face of the panel of a cathode ray tube is arranged within a vacuum chamber and hermetically sealed from the outside of the vacuum chamber. Under this condition, a thin film is formed on the face of the panel. It follows that the present invention makes it possible to diminish markedly the inner volume of the vacuum chamber, leading to a shortened evacuation time and an improved productivity, compared with the prior art in which the entire cathode ray tube is housed in a vacuum chamber.

It should also be noted that, in the present invention, an organic conductive material layer of the cathode ray tube need not be arranged within the vacuum chamber. It follows that the gas contained in the organic conductive material layer need not be discharged to the outside in the evacuating step of the vacuum chamber, making it possible to shorten the evacuating time.

Further, a reinforcing band serving to fasten the panel and funnel of the cathode ray tube need not be arranged within the vacuum chamber in the present invention, with the result that the cathode ray tube is capable of maintaining a sufficiently high resistance to implosion.

BRIEF DESCRIPTION OF THE DRAWINGS

FIG. 3 schematically shows an apparatus for manufacturing a cathode ray tube according to one embodiment of the present invention;

FIG. 4 shows in a magnified fashion an example as to how to hold the panel of the cathode ray tube in the present invention;

FIG. 5 shows in a magnified fashion another example as to how to hold the panel of the cathode ray tube in the present invention;

DESCRIPTION OF THE INVENTION

Figure 1:
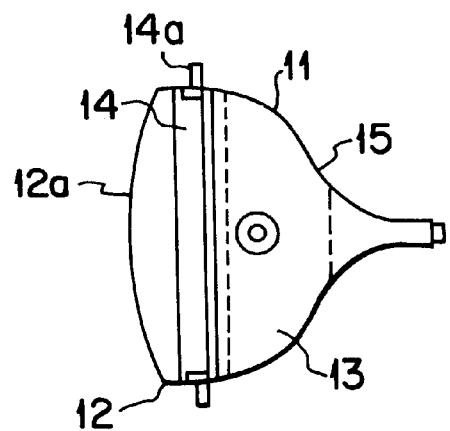
FIG. 1 is side view showing the construction of a general cathode ray tube.

According to a first aspect of the present invention, there is provided a method of manufacturing a cathode ray tube, comprising the steps of hermetically sealing a vacuum chamber from the outside of said vacuum chamber and holding at least an effective region of the face of a panel of a cathode ray tube within the vacuum chamber; and forming a thin film on said face of the panel by using film-forming means.

According to a second aspect of the present invention, there is provided an apparatus used for working the manufacturing method according to the first aspect. The apparatus comprises a vacuum chamber, a hermetic sealing means mounted in a part of the vacuum chamber so as to hold at least the effective region of a face of the panel of a cathode ray tube within the vacuum chamber, and a vacuum film-forming apparatus equipped with a film-forming means positioned within the vacuum chamber.

It is desirable for the vacuum chamber to comprise a first region in which at least an effective region of the face of the panel of the cathode ray tube is held, and a second region partitioned from the first region by an openable valve mechanism and having a film-forming means arranged therein.

The step of hermetically sealing the vacuum chamber is carried out by closing a passage between the first region and the second region. The step of forming a thin film is carried out by opening a passage between the first region and the second region. Further, the step of detaching the cathode ray tube from the vacuum chamber after formation of the thin film on the face of the panel is carried out by closing a passage again between the first region and the second region. The passage may, for example, be close/opened by an openable valve mechanism.

The hermetic sealing means used preferably in the present invention includes, for example, an O-ring, a hollow O-ring and a packing having a tongue-shaped cross sectional shape.

The thin film formed in the present invention performs preferably the functions of an anti-reflection film and/or antistatic film. Also, the thin film should desirably be of a multi-layer structure. A typical example of the thin film formed in the present invention is an anti-reflection film of a laminate structure consisting of a zirconium oxide thin layer and a silicon dioxide thin layer.

For forming a thin film of a multi-layer structure, a plurality of movable film-forming sources can be arranged within, for example, a vacuum film-forming device. These plurality of film-forming sources can be moved depending on the desired film thickness by a moving means of, for example, a rotary type or sliding type.

Where a plurality of movable film-forming sources are not arranged, it is possible to arrange a plurality of film-forming devices. In this case, different film-forming sources are arranged in these vacuum film-forming devices, and the panel, on which a thin film is to be formed, of the cathode ray tube is successively moved from, for example, a first vacuum film-forming device to a second vacuum film-forming device.

Let us describe the present invention more in detail with reference to the accompanying drawings. Incidentally, the members of the apparatus common with those described previously in conjunction with the prior art are denoted by the same reference numerals so as to omit the overlapping description.

FIG. 3 schematically shows the construction of an apparatus for manufacturing a cathode ray tube according to one embodiment of the present invention. As shown in the drawing, the apparatus comprises a vacuum chamber 28 which is partitioned by an openable valve mechanism 38 into a first region 28A and a second region 28B. A holding means 29 for holding a face 12a of the panel of the cathode ray tube 11 is arranged to permit the face 12a to be positioned within the first region 28A of the vacuum chamber 28. On the other hand, a film-forming means 34, e.g., a gaseous phase film-forming means, is arranged within the second region 28B of the vacuum chamber 28 in a manner to face the face 12a of the panel of the cathode ray tube 11.

The first region 28A of the vacuum chamber 28 is provided with a first exhaust port 31, which is connected to an exhaust device (not shown) via a valve 32. Likewise, the second region 28B of the vacuum chamber 28 is provided with a second exhaust port 35, which is connected to an exhaust device (not shown) via a valve 36.

The holding means 29 is mounted to surround an effective region of the face 12a of the panel of the cathode ray tube 11. An O-ring 30 made of a resin is mounted as a hermetic sealing means at the contact region between the holding means 29 and the face 12a of the cathode ray tube 11 so as to hermetically close the vacuum chamber from the outside.

As described previously, a film-forming means such as a sputtering device 34 is arranged within the second region 28B of the vacuum chamber 28 in a position to face the face 21a of the cathode ray tube 11. The sputtering device 34 comprises a target 19 and a power source device 37 for ejecting the atoms forming the target 19 from the target 19 under a predetermined electrical condition.

Further, the vacuum chamber 28 is partitioned by a valve mechanism, e.g., a gate valve 38, into the first region 28A and the second region 28B, as described previously. These first and second regions 28A and 28B of the vacuum chamber 28 are allowed to communicate with or separated from each other by the gate valve 38. When the face 12a of the cathode ray tube 11 is mounted to and detached from the face holding means 29, the gate valve 38 is closed. By closing the gate valve 38, the first and second regions 28A and 28B of the vacuum chamber 28 can be evacuated independently. For example, even where the first region 28A has atmospheric pressure, the second region 28B can be held at a vacuum state. After the cathode ray tube 11 is mounted, the first region 28A of the vacuum chamber 28 is evacuated, and the gate valve 38 is opened under the condition that the first region 28A is held vacuum.

In the embodiment described above, a holding means equipped with an O-ring as a hermetic sealing means is used for holding the face 12a of the panel of the cathode ray tube 11. However, another hermetic sealing means can also be used in the present invention. Also, it is possible to hold a skirt portion of the panel of the cathode ray tube. Each of FIGS. 4 and 5 shows another example of holding the panel of the cathode ray tube.

In the example shown in FIG. 4, a holding means 50 equipped with a packing 51 having a tongue-like cross sectional shape, said packing 51 acting as a hermetic sealing means, is used for holding the face 12a of the panel of the cathode ray tube 11.

Also, in the example shown in FIG. 5, a holding means 55 equipped with a hollow O-ring 56 as a hermetic sealing means is used for holding a skirt portion of the panel of the cathode ray tube 11. The holding means 55 is provided with an air passageway 57 communicating with the hollow O-ring 56. The air is supplied through the air passageway 57 into the hollow O-ring 57 so as to swell the hollow O-ring 57 and, thus, to ensure a sufficient hermetic sealing state.

Figure 6:
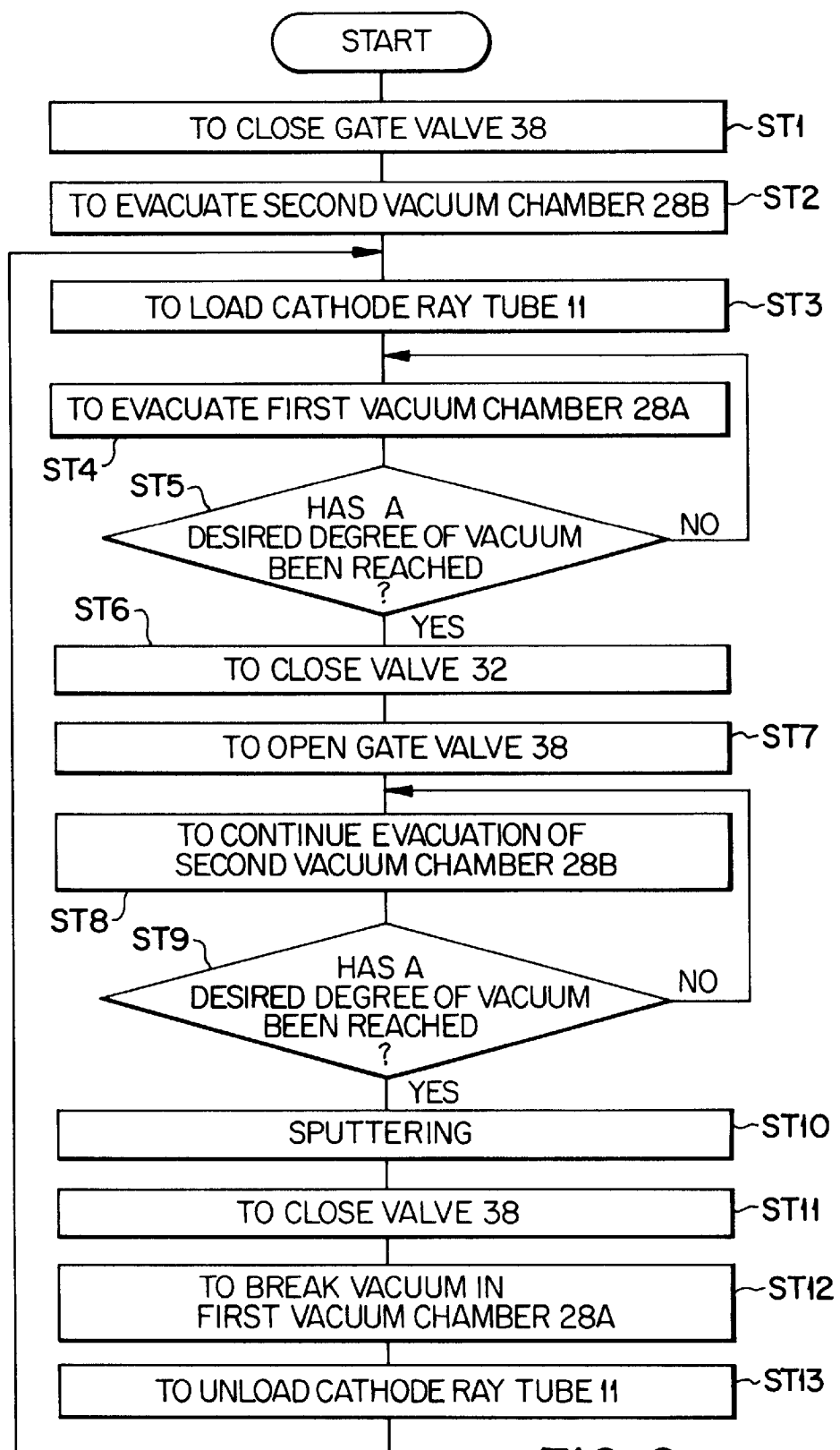
FIG. 6 is a flow chart exemplifying the procedure for manufacturing a cathode ray tube of the present invention.

FIG. 6 is a flow chart showing the process of forming a thin film of a multi-layer structure on the face 12a of the panel of the cathode ray tube 11.

In the first step, the gate valve 38 is closed before the cathode ray tube 11 is mounted to the vacuum chamber 28 so as to separate the first and second regions 28A and 28B of the vacuum chamber 28 from each other (ST 1).

Then, an exhaust device (not shown) is driven and, at the same time, the valve 36 is opened so as to evacuate the second region 28B of the vacuum chamber 28 (ST 2), followed by loading the cathode ray tube 11 in the vacuum chamber 28 (ST 3). In the loading step of the cathode ray tube 11, the face 12a of the panel of the cathode ray tube 11 is mounted on the packing 30 of the face holding means 29 to permit an effective region of the face 12a to constitute an upper end of the first region 28A of the vacuum chamber 28.

In the next step, load is applied to the cathode ray tube 11 and, then, the first region 28A of the vacuum chamber 28 is evacuated by opening the valve 32 (ST 4). The evacuation is continued until a desired vacuum is produced within the first region 28A (ST 5). When a desired vacuum is produced within the first region 28A, the valve 32 is closed (ST 6).

In the next step, the gate valve 38 is opened to permit the first region 28A to communicate with the second region 28B of the vacuum chamber 28 (ST 7). Under this condition, the entire vacuum chamber 28 including the first and second regions 28A and 28B is evacuated through the exhaust port 35 of the second region 28B (ST 8). The evacuation is continued until a desired vacuum is produced in each of the first and second regions 28A and 28B of the vacuum chamber 28 (ST 9).

When a desired vacuum is produced within the entire vacuum chamber 28, the power source device 37 is turned on so as to carry out a sputtering operation (ST 10). In this step, a desired electrical condition is applied to the target 19 so as to form the anti-reflection film 16 on the face 12a of the panel of the cathode ray tube 11, said anti-reflection film 16 consisting of the material of the target 19.

A predetermined time later, the gate valve 38 is closed so as to separate the face 12a of the cathode ray tube 11 from the second region 28B of the vacuum chamber 28 (ST 11). After the gate valve 38 is closed, the vacuum state within the first region 28A is broken (ST 12) so as to expose the face 12a of the cathode ray tube 11 to the outer atmosphere. After atmospheric pressure is set up within the first region 28A of the vacuum chamber 28, the cathode ray tube 11 is unloaded from the vacuum chamber 28 (ST 13).

It should be noted that the second region 28B of the vacuum chamber 28 is held at a high vacuum in step ST13 because the second region 28B is separated from the first region 28A by the gate valve 38.

Therefore, it suffices to evacuate the first region 28A alone in step after the cathode ray tube 11 is loaded in step 3. Also, if the gate valve 38 is opened in step ST8 after evacuation of the first region 28A to permit the first region 28A to communicate with the second region 28B, the entire vacuum chamber 28 is immediately evacuated to arrive at a desired vacuum state in step 9, making it possible to carry out the sputtering operation immediately in step 10. In short, the evacuating time can be markedly shortened in the second treatment, et seq., leading to a marked improvement in productivity, compared with the prior art.

It should also be noted that the effective region alone of the face 12a of the panel of the cathode ray tube 11 is exposed to a high vacuum in the present invention. This makes it possible to prevent the difficulty inherent in the prior art that, since the entire cathode ray tube 11 is disposed under an environment of a high vacuum, the difference in pressure between the inside and the outside of the cathode ray tube 11 is diminished so as to bring about expansion of the cathode ray tube 11. In the prior art, the expanded cathode ray tube 11 is then shrunk, with the result that force is applied to the band 14. The cathode ray tube is free from the expansion-shrinkage noted above in the present invention, with the result that the cathode ray tube 11 exhibits a high resistance to implosion.

For forming a thin film of a multi-layer structure consisting of a plurality of different kinds of thin layers, the target can be replaced every time a thin layer is formed. In this case, it certainly takes time to replace the target 19. However, a plurality of thin layers can be formed within the single vacuum chamber 28, leading to simplification in construction of the facility.

Alternatively, for forming a thin film of a multi-layer structure consisting of a plurality of different kinds of materials, it is possible to use a plurality of vacuum chambers 28 as shown in FIG. 3 comprising the targets 19 formed of different materials.

Further, it is also possible to dispose different kinds of targets on a movable table of, for example, a rotary type or sliding type so as to move the target depending on the kind of the thin layer to be formed.

Figure 7:
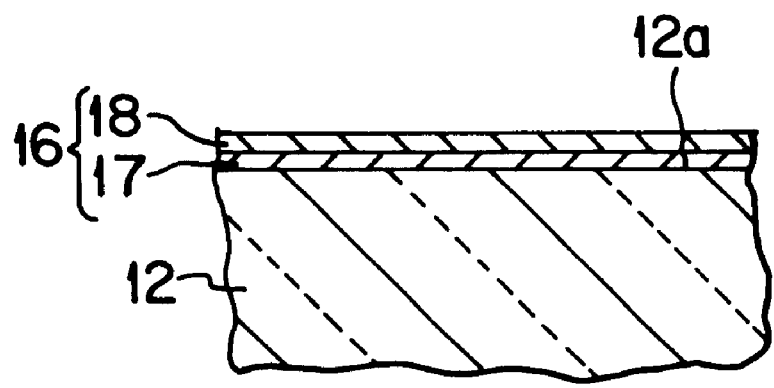
FIG. 7 shows in a magnified fashion an anti-reflection film of a multi-layer structure included in the cathode ray tube of the present invention.

FIG. 7 exemplifies a thin film 16 of a multi-layer structure formed by employing the step of forming a plurality of thin layers described above. In this example, a first thin layer 17 is formed by using a first target made of zirconium oxide, followed by forming a second thin layer 18 by using a second target made of silicon dioxide. The resultant multi-layer structure is formed on the face 12a of the panel of the cathode ray tube 11 so as to constitute the anti-reflection film 16 of a multi-layer structure consisting of the zirconium oxide thin layer 17 and the silicon dioxide thin layer 18.

It is also possible to obtain a multi-layer structure by forming a transparent electrically conductive film by using a first target made of tin oxide, followed by forming an anti-reflection film by using a second target made of silicon dioxide.

Figure 8:
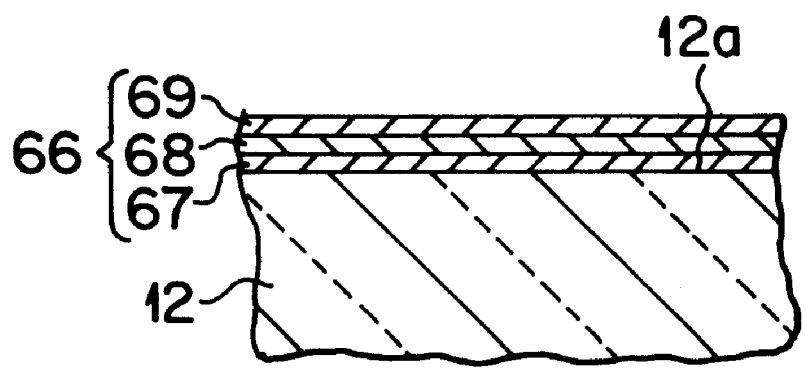
FIG. 8 shows in a magnified fashion an anti-reflection film of another multi-layer structure included in the cathode ray tube of the present invention.

FIG. 8 shows another example of a multi-layer structure formed in the present invention. In this example, a multi layer is formed by employing the step of forming a multi-layer structure described previously, by using silicon dioxide and titanium dioxide as a first target, tin dioxide as a second target, silicon dioxide as a third target. It follows that the thin film 66 formed on the face 12a of the panel 12 is of a multi-layer structure consisting of a mixed thin layer 67 consisting of silicon dioxide and titanium dioxide, a thin layer 68 made of tin dioxide, and a thin layer 69 made of silicon dioxide. The resultant multi-layer structure performs three functions, i.e., the functions of anti-reflection layer, electromagnetic wave shield layer and anti-static layer.

In the embodiment described above, a direct sputtering method is used. However, another vacuum apparatus or method using another vacuum apparatus including, for example, an RF sputtering apparatus or a vacuum vapor deposition apparatus, can also be used in the present invention.

The material of the thin film is not particularly limited in the present invention, as far as a thin film can be formed by using a vacuum apparatus.

It is also possible to form a multi-layer structure by using a coated layer formed by a wet spinning method of spraying method in combination with the thin layer formed by the method of the present invention.

Figure 2:
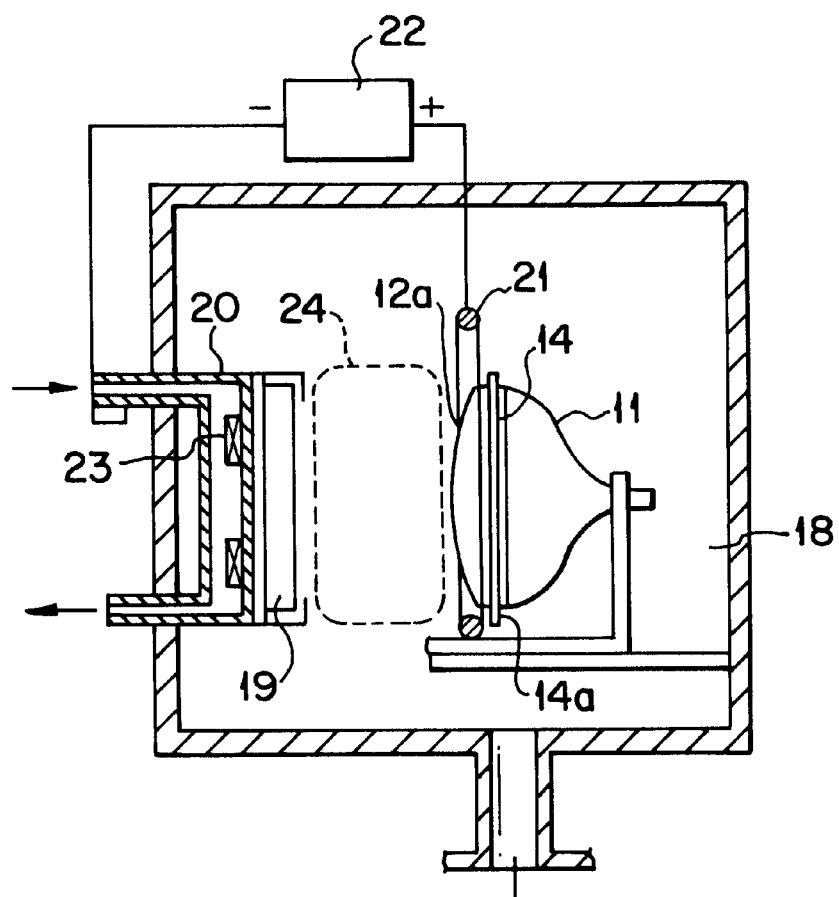
FIG. 2 schematically shows a conventional thin film-forming apparatus utilizing a sputtering technique.

In the embodiment shown in the drawings, the gate valve 38 is formed for partitioning the inner space of the vacuum chamber into the first region 28A and the second region 28B. However, another valve mechanism can also be used. Incidentally, a longer evacuation time is required in the second film forming operation, et seq., if the gate valve 38 is not used. However, the required evacuation time is markedly shorter than in the prior art shown in FIG. 2 in which the entire vacuum chamber having the entire cathode ray tube 11 put therein is evacuated. In addition, since force is not applied to the band 14, the cathode ray tube exhibits a sufficiently high resistance to implosion. Under the circumstances, it is possible to omit the gate valve 38 used as a valve mechanism.

Figure 9:
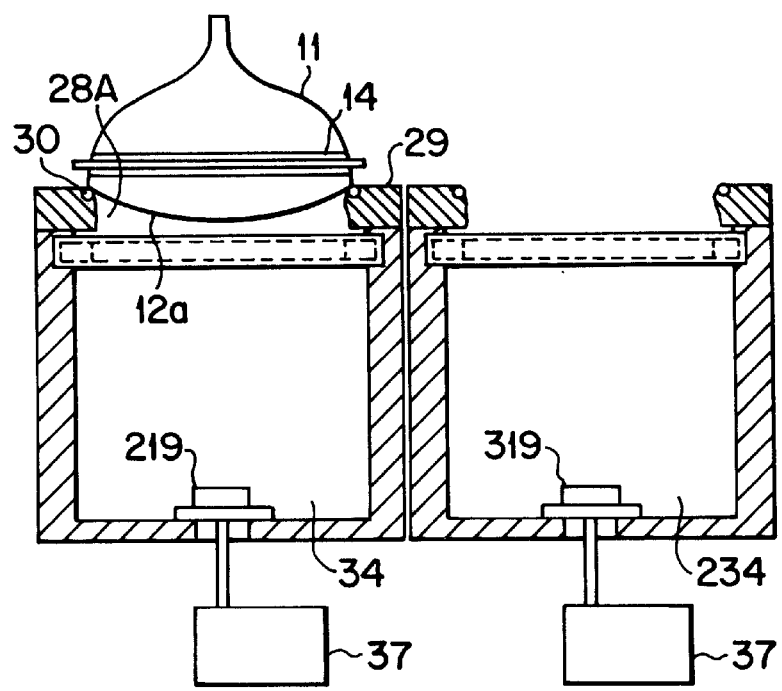
FIG. 9 is a sectional view of an embodiment having a plurality of film-forming devices.

FIG. 9 shows an example of another apparatus, which includes a plurality of said vacuum film-forming devices for manufacturing a cathode ray tube. In the apparatus shown in FIG. 9, two chambers 34, 234 having two different targets 219, 319 arranged therein, respectively, are arranged side by side. Each of these chambers 34, 234 is substantially equal in construction to the chamber shown in FIG. 3. Naturally, each of these chambers 34 and 234 includes the first exhaust port 31, the valve 32, the second exhaust port 35 and the valve 36, though these members 31, 32, 35 and 36 are not shown in FIG. 9.

Figure 10:
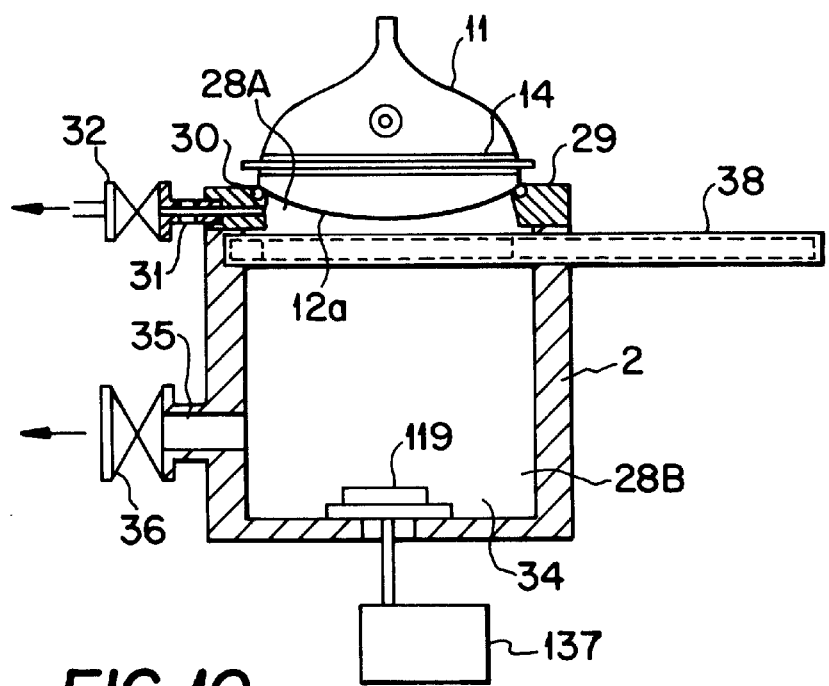
FIG. 10 is a sectional view of an embodiment including a plurality of movable film-forming sources.

FIG. 10 shows still another example of an apparatus which includes a plurality of movable film-forming sources for manufacturing a cathode ray tube. The apparatus shown in FIG. 10 is substantially equal in construction to the apparatus shown in FIG. 3, except that the apparatus shown in FIG. 10 includes a stepping motor 137, which is used in place of the power source 37, for rotating stepwise a rotatable table 119 supporting a plurality of film-forming sources. The rotatable table 119 has the function of moving a predetermined film-forming source to a position where the sputtering is performed.

Incidentally, the film-forming means employed in the present invention is not limited to the gaseous phase film-forming method. It is possible to employ any type of a thin film-forming method utilizing a vacuum chamber such as a vapor deposition method and a sputtering method.

What is claimed is:

1. A method of manufacturing a cathode ray tube, comprising:
   providing a vacuum film forming apparatus including:
      a chamber having an upper open end, a first exhaust port, and a second exhaust port, the first and second exhaust ports having valves connected thereto and arranged below the upper open end,
      a gate valve positioned between the first and second exhaust ports,
      a hermetic sealing device arranged on a side of at least the upper open end of said chamber, and
      a film-forming device arranged within said chamber;
   closing said gate valve to partition said chamber into a first region having the upper open end and the first exhaust port, and a second region having the second exhaust port;
   evacuating the second region of said chamber through the second port;
   mounting a faceplate of a cathode ray tube on said upper open end of said chamber through said hermetic sealing device, said faceplate of said cathode ray tube being downwardly arranged,
   evacuating the first region of said chamber to a vacuum state through the first port;
   opening said gate valve;
   forming a thin film on said faceplate by using said film forming device;
   closing said gate valve;
   opening said gate valve connected to the first exhaust port to break the vacuum state within the first region of said chamber,
   unloading said cathode ray tube from said chamber; and
   mounting an additional faceplate of another cathode ray tube on said upper open end of said chamber through said hermetic sealing device, said additional faceplate being downwardly arranged; and
   repeating said evacuating the first region, said opening said gate valve, said forming a thin film on said face plate, said closing said gate valve, said opening said gate valve connected to the first exhaust port, and said unloading said cathode ray tube from said chamber.

2. The method of manufacturing a cathode ray tube according to claim 1, wherein hermetically sealing the chamber is carried out by using hermetic sealing device selected from the group consisting of an O-ring, a hollow O-ring, and a tong-shaped packing.

3. The method of manufacturing a cathode ray tube according to claim 1, wherein said thin film substantially constitutes an anti-reflection film.

4. The method of manufacturing a cathode ray tube according to claim 1, wherein said thin film includes an anti-static layer.

5. The method of manufacturing a cathode ray tube according to claim 1, wherein said thin film is of a multi-layer structure.

6. The method of manufacturing a cathode ray tube according to claim 5, wherein said multi-layer structure includes a zirconium oxide thin layer and a silicon dioxide thin layer.

7. An apparatus for manufacturing a cathode ray tube, including a vacuum film forming apparatus, comprising:
   a chamber having an upper open end, a first exhaust port, and a second exhaust port, the first and second exhaust ports having valves connected thereto and arranged below the upper open end;
   a gate valve positioned between the first and second exhaust ports so as to partition said chamber into a first region having the upper open end and the first exhaust port, and a second region having the second exhaust port;
   a hermetic sealing device arranged on the upper open end of said chamber, through which a face plate of said cathode ray tube is mounted on the upper open end of said chamber, said faceplate of said cathode ray tube being downwardly arranged; and
   a film-forming device arranged within said chamber.

8. The apparatus for manufacturing a cathode ray tube according to claim 7, wherein said hermetic sealing device is selected from the group consisting of an O-ring, a hollow O-ring, and a tong-shaped packing.

9. The apparatus for manufacturing a cathode ray tube according to claim 7, wherein said thin film substantially constitutes an anti-reflection film.

10. The apparatus for manufacturing a cathode ray tube according to claim 7, wherein said thin film includes an anti-static layer.

11. The apparatus for manufacturing a cathode ray tube according to claim 7, wherein said thin film is of a multi-layer structure.

12. The apparatus for manufacturing a cathode ray tube according to claim 11, wherein said multi-layer structure includes a zirconium oxide thin layer and a silicon dioxide thin layer.

13. The apparatus for manufacturing a cathode ray tube according to claim 7, wherein said film-forming device includes a plurality of movable film-forming sources.

14. The apparatus for manufacturing a cathode ray tube according to claim 7, wherein a plurality of said vacuum film-forming apparatus are arranged.

* * * * *